United States Patent [19]

Ester

[11] 4,261,519
[45] Apr. 14, 1981

[54] AIR DISTRIBUTION SYSTEM

[75] Inventor: Charles E. Ester, Glendale, Ariz.

[73] Assignee: Honeywell Information Systems Inc., Phoenix, Ariz.

[21] Appl. No.: 971,468

[22] Filed: Dec. 20, 1978

[51] Int. Cl.³ .............................................. A62C 31/10
[52] U.S. Cl. ........................................ 239/548; 98/36; 62/418
[58] Field of Search ............ 98/40 D, 40 C, 36, 40 N; 34/195, 232; 239/548, 553.3, 553.5, 557, 568, 590.3; 62/418; 432/77; 165/59, DIG. 1; 237/50

[56] References Cited

U.S. PATENT DOCUMENTS

| | | | |
|---|---|---|---|
| 2,230,203 | 1/1941 | Mack et al. | 98/40 C |
| 3,251,289 | 5/1966 | Mariner | 98/40 D |
| 3,421,696 | 1/1969 | Carloni | 239/548 X |
| 3,744,724 | 7/1973 | Caille | 239/553.5 |
| 3,817,160 | 6/1974 | Searcy et al. | 239/598 |

*Primary Examiner*—Robert B. Reeves
*Assistant Examiner*—Gene A. Church
*Attorney, Agent, or Firm*—Edward H. Hughes; William W. Holloway, Jr.; Nicholas Prasinos

[57] ABSTRACT

An improved large capacity air distribution system for cooling electronic components mounted on printed circuit boards. The system has an air plenum chamber of substantially constant rectangular cross section. Openings are formed in the side walls of the chamber to permit air from within the chamber to flow outwardly in a direction substantially normal to the outer surfaces of the side walls and over the components to be cooled. A baffle in the form of a tapered wedge formed from a pair of thin metal baffle sheets is mounted in the plenum chamber so that the joined edges of the metal baffle sheets are positioned centrally in the air inlet of the chamber and the baffle is otherwise symmetrically disposed in the chamber. A large number of small round holes are formed through the sheets of the baffle, the area of the holes occupying a substantial percentage, approximately 36 percent, of the total area of the baffle. A high capacity air pump supplies air under pressure to the interior of the plenum chamber. The baffle modifies the pressure distribution and air flow within the chamber, so that the quantity of air flowing through the openings formed in the side walls per unit of time does not substantially vary with the position of the openings along the length of the plenum of such a large capacity system.

16 Claims, 5 Drawing Figures

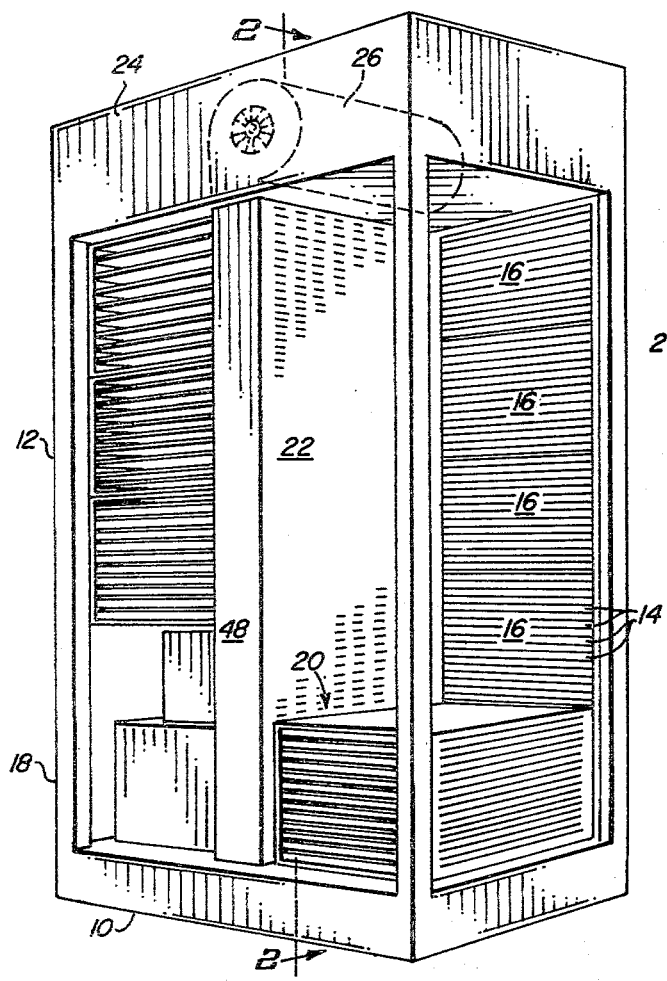
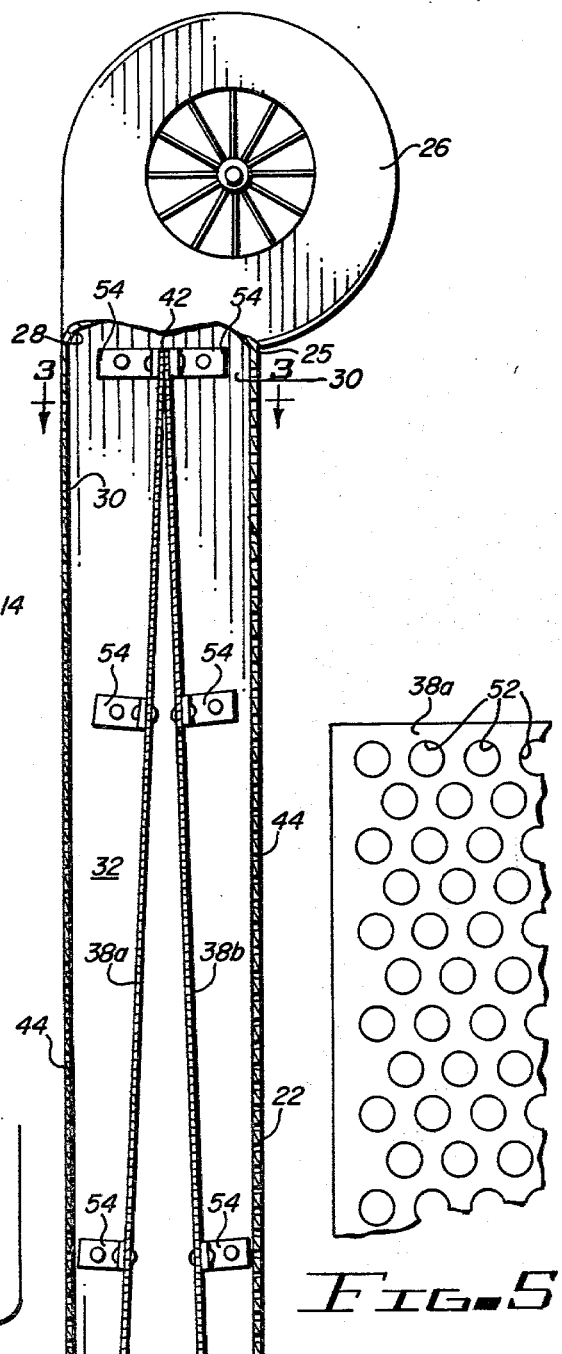
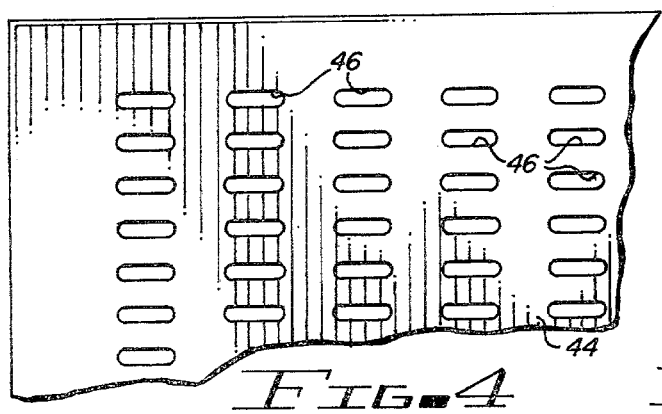
U.S. Patent     Apr. 14, 1981     4,261,519

AIR DISTRIBUTION SYSTEM

BACKGROUND OF THE INVENTION

1. Field of the Invention

This invention is in the field of apparatus for controlling air flow through openings in the side walls of a pressurized plenum chamber, particularly, by a baffle that induces turbulent flow within the chamber, substantially dampens out oscillations in the flow of air within the chamber, and substantially equalizes pressure within the chamber so that there is no significant difference in the rate of flow of air through openings in the side walls of the plenum as a function of the position of the openings along the length of the plenum.

2. Description of the Prior Art

In large electronic systems such as digital data processing systems it is well known to cool the components that produce heat; semiconductor devices, resistors, power supplies, etc. by directing streams of air moving at a relatively high velocity over such devices. With the development of medium and large scale integrated circuits, such circuits are frequently mounted on printed circuit boards which boards are in turn mounted on fixtures, or racks, so that large numbers of such boards are positioned in close proximity to one another to facilitate electrical interconnections between boards. To provide the necessary quantity of air to cool the components mounted on these boards, an air duct, or plenum chamber, closed at one end is mounted in the cabinet in which the circuit boards with their components mounted on them are located. The plenum chamber can be mounted vertically, or horizontally, preferably perpendicular to the planes in which the printed circuit boards lie, and has essentially a uniform cross sectional area along its entire length. Air metering openings are formed in the side walls of the plenum chamber to direct air over the components to be cooled. An air pump provides the cooling air and is connected to the air inlet end of the plenum chamber with the other end of the chamber being closed.

The problem with prior art systems for distributing air to cool components in complex electrical systems is the result of increasing the amount of cooling air to be distributed by the system while maintaining the dimensions of the system, particularly the cross sectional area of the plenum chamber constant. Increasing the amount of air forced into plenum chamber per unit time results in an uneven distribution of air flowing through the metering slots in side walls of the plenum chamber as a function of the distance of such openings from the air pump. The velocity of air flowing through the metering slots at the more distant, or closed, end of the chamber is at a maximum, and at a minimum through the metering slots nearest the pump. The reason for the variations in flow rates through air metering openings of substantially the same size is due to the magnitude and direction of the velocity vector of the air as it enters the plenum chamber. The velocity vector is at its maximum magnitude at the entrance to the chamber and its direction is substantially parallel to the side walls so that the air flows through the air metering openings in the upper portion of the chamber only at a significantly reduced velocity. Near the closed end of the chamber the magnitude of the velocity vector approaches zero as its limit so that air flows through the metering openings in the side walls in the lower portion of the chamber at a maximum rate corresponding to the static pressure of the air in the chamber. In addition the air flow from the air pump, typically a centrifugal blower, does not have a constant velocity profile across the air stream produced. The air stream has a higher velocity center core which tends to bounce, or to be reflected, from the side walls of the plenum chamber so that oscillations, or oscillatory changes in pressure, occur within the chamber. This phenomena further exacerbates the uneven distribution of flow rates through the air metering openings along the length of the side walls of the plenum chamber. The variations in flow rates result in inadequate cooling of some components to the detriment of their reliable performance, particularly over a sustained period of time.

SUMMARY OF THE INVENTION

The present invention provides an improved baffle construction in an air distribution system including an air plenum chamber with air distribution or metering slots in its side walls, and an air pump for supplying a continuous stream of air under pressure to the chamber. A baffle such as that disclosed in an Application entitled Improved Air Distribution System by Arthur Gee, Edward J. Largo, and Boris Plesinger, which is assigned to the same assignee as this Application and was filed in the U.S. Patent Office concurrently with this Application is made from a thin sheet of material which is mounted substantially in the center of the plenum chamber and parallel to the side walls of the chamber. This baffle produces substantially uniform flow rates through the metering slots irrespective of the location of the slots under certain conditions. In the Gee et al Application the baffle extends substantially the full length of the chamber and is provided with a large number of openings of substantially uniform size. The maximum area of the holes approaches 40 percent of the total cross sectional area of the baffle as a limit. The baffle occupies a very small part of the volume of the chamber so that it does not of itself significantly reduce the capacity of the chamber to transmit air from the pump to the device to be cooled. However, while an air distribution system such as that disclosed in the Gee, et al Application is effective when supplied with air at rates over a given range of values, measured in terms of cubic feet per minute, for example, attempts to distribute from 50 to 100 percent more air through a system having the dimensions disclosed in the Gee, et al Application, produces an uneven distribution of air flow rates through the air metering slots in the side walls of the plenum chamber of such systems. Applicant has discovered that arranging a pair of thin planar baffle sheets, such as the sheet baffle disclosed in the Gee, et al Application, and arranging them in the form of a wedge, with the edge of the wedge being positioned centrally in the air inlet opening of the plenum chamber and with the other ends of the planar baffle sheets being spaced apart and located substantially in the closed end of the chamber increases the capability of the distribution system to distribute larger amounts of air while delaying the onset of unstable air flow within the chamber which results in the uneven distribution of flow rates through the air metering slots as a function of the length of the plenum chamber.

The wedge, or "V" shaped baffle essentially increases the capability of the baffle to induce turbulent flow and concommitently to prevent the establishing of laminar flow within the plenum chamber as well as to increase the capability of the baffle to dampen oscillations, particularly transverse oscillations of air within the chamber at higher flow rates. The large number of small openings through the planar baffle sheets of the wedge shaped baffle also tend to substantially equalize the static pressure within the chamber even at substantially higher flow rates. As a result, air flow through the air metering slots in the side walls of the plenum chamber are substantially uniform and independent of the position of the slots along the length of the chamber at substantially greater flow rates than is possible with prior art baffles.

It is therefore an object of this invention to provide an improved air distribution system in which a wedge shaped baffle is positioned in the plenum chamber of the system, which wedge shaped baffle tends to inhibit laminar flow to dampen out oscillations of the air flow within the chamber and substantially to equalize the pressure of the air within the chamber when air is supplied to the chamber at high flow rates.

It is another object of this invention to provide an air distribution system for cooling electronic components in which the rate of air flow through air flow metering slots in the side walls of the plenum chamber of such a system is substantially uniform throughout the length of the chamber at higher system flow rates.

It is yet another object of this invention to provide an improved baffle for an air distribution system which is relatively low in cost, is easy to fabricate and can be readily installed in a plenum chamber.

BRIEF DESCRIPTION OF THE DRAWINGS

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure, and in which:

FIG. 1 is a perspective view of a cabinet of an electronic system provided with the air distribution system of the present invention.

FIG. 2 is a sectional view taken on lines 2—2 through the plenum of the air distribution system of FIG. 1.

FIG. 3 is an enlarged section taken on lines 3—3 of FIG. 2.

FIG. 4 is an enlarged fragmentary view of a portion of side wall of a plenum chamber.

FIG. 5 is an enlarged fragmentary view of a portion of a planar baffle sheet of the baffle of this invention.

DETAILED DESCRIPTION OF THE INVENTION

In FIG. 1, cabinet 10 is designed to hold a large number of printed circuit boards 12 which are plugged into connectors 14. Connectors 14 are fixedly secured to backpanels 16. Cabinet 10 is provided with a frame 18 to which are secured backpanels 16 and fixtures, or card cages, 20. In FIG. 1, only one empty card cage 20 is illustrated in the lower right hand half of cabinet 10 to provide a better view of plenum chamber, or air duct, 22 which, in the preferred embodiment, is mounted vertically in cabinet 10. Attached to the upper portion of frame 18 is housing 24 in which a blower, or air pump, 26 is mounted. The outlet 28 of pump 26 is connected to the air inlet opening 30 of plenum chamber 22 to supply air under pressure to the interior 32 of plenum chamber 22 as can be best seen in FIG. 2. Baffle 36 is made of a pair of thin planar baffle sheets 38(a), 38(b), such as 16 gage cold rolled low carbon steel. Baffle sheets 38(a), 38(b) are mounted in the interior 32 of chamber 22 to form wedge shaped or "V" shaped baffle 36. Edges 40(a), 40(b) of sheets 38(a), 38(b) are positioned in substantial contact to form the edge, or apex, 42 of baffle 36. Baffle 36 is positioned in chamber 22 so that edge 42 of baffle 36 is located centrally within opening 30 of chamber 22, as is best seen in FIG. 3. Planar sheets 38(a), 38(b) whose widths are substantially equal to the width of the plenum chamber 22 are disposed substantially symmetrically within chamber 22 and extend substantially to the closed end 34 of chamber 22. Sheets 38(a), 38(b) with apex, or edge 42 define an angle $\alpha$ where $\alpha$, in the preferred embodiment, is substantially equal to 1.5°. Plenum 22 has a pair of side walls 44 which are provided with air metering slots, or openings, 46. Air metering slots 46 permit air from the interior 32 of plenum chamber 22 to escape and to blow over electronic components mounted on printed circuit boards 12 positioned in card cages 20 in proximity to side walls 44. Plenum chamber 22 also has a pair of end walls 48 and a bottom plate or wall 50 which closes end 34 of plenum chamber 22 to prevent air from flowing out of plenum chamber 22 through end 34.

In FIG. 5 details of baffle sheet 38 can be seen. Sheet 38(a), for example, is provided with a large number of substantially circular openings 52 which are substantially uniformly distributed throughout the length and breadth of baffle sheet 38(a). Baffle sheet 38(b) is substantially identical to sheet 38(a). Brackets 54 are secured to baffle sheets 38(a), 38(b) and secure sheets 38(a), 38(b) to side walls 48 by rivets, for example, so that the apex 42 of wedge shaped baffle 36 is positioned centrally in air inlet opening 30 as can be seen best in FIG. 3.

In the preferred embodiment, side walls 44 are substantially planar and have the same dimensions and rectangular shape. The two end walls 48 are also substantially planar and have the same dimensions and rectangular shape. End walls 48 have the same length but different widths compared to side walls 44. Walls 44 and 48 are joined together to form plenum chamber 22 which has a substantially uniform, or constant rectangular cross sectional area from air inlet opening 30 to closed end 34. In the preferred embodiment, plenum chamber 22 is substantially 3 inches wide, 10 inches long and its height, or length, the distance between air inlet opening 30 and closed end 34, is approximately 69 inches. The metering slots 46 which are formed through side walls 44 are positioned to cause air to flow over electronic components mounted on printed circuit boards 12. The pattern or arrangement of air metering slots 46 can be substantially as illustrated in FIG. 4. In a preferred embodiment the length of a metering slot 46 is $\frac{3}{4}$ of an inch, the spacing between slots in a row is $\frac{1}{4}$ of an inch and the spacing between rows of slots 46 is 0.6 inch. Also, in the preferred embodiment, the size of openings 52 formed through baffle sheets 38(a), 38(b) is $\frac{1}{8}$ inch and there are preferably 29 of openings 52 per square inch of surface area of sheets 38(a), 38(b). The ratio of the area of the openings 52 to the surface area of baffle sheets 38(a), 38(b) is approximately 36 percent. In the preferred embodiment blower 26 is a centrifugal blower having a capacity of 1,200 cubic feet per minute when the back pressure is substantially zero.

In operation blower 26 will direct a stream of relatively high velocity air into air inlet opening 30 of plenum chamber 22. The presence of baffle 36 which has the shape of a pointed wedge or "V" with its large number of openings 52 in sheets 38(a), 38(b) which together form baffle 36 and which extends substantially the full length of chamber 22 induces turbulent flow in the air stream from pump 26 particularly in the upper portions of plenum chamber 22. As a result, air will flow through air metering slots 46 located close to air inlet opening 30 and the air pump 26 at substantially the same rate as the air flowing through the metering slots 46 located near closed end 34 of plenum chamber 22.

It is believed that the large number of small openings 52 in sheets 38(a), 38(b) tends to (1) induce turbulent flow, (2) dampen oscillations, particularly transverse oscillations, which in the absence of baffle 36 would be induced by the high velocity stream of air flowing through air inlet openings 30 striking the interior surface of side walls 44 of plenum chamber 22 and being reflected off of them. In addition the large number of holes, or openings 52, or the ratio of the area of the holes 52 to the total surface area of the baffle sheets 38(a), 38(b) results in the static pressure distribution in chamber 22 being maintained substantially constant. The equalization of pressure within chamber 22 also helps to even, or smooth out variations in the distribution of velocity of air flowing through each of metering slots 46 in the side walls even when the system is required to distribute significantly greater quantities of air per unit time. Tests have been conducted with a plenum chamber 22 having dimensions set forth above which has a cross sectional area of substantially 30 square inches. Air flows through the metering slots 46 at a velocity of substantially 960 feet per minute throughout the full length of plenum chamber 22.

Changes in the size and number of holes 58 per unit area of the surface area of baffle sheets 38(a), 38(b) affects the effectiveness of baffle 36. If openings 52 are too small, baffle sheets 38(a), 38(b) will act as if they were solid sheets and the benefits resulting from inducing turbulent flow, damping oscillations, and equalizing the pressure within chamber 22 are not achieved. If openings 52 are too big, then the turbulence induced by baffle sheets 38(a), 38(b) and their capability for damping out oscillations is reduced which will ultimately result in the pressure distribution within chamber 22 and the velocity of air flowing through the metering slots 46, particularly at the upper portion of plenum chamber 22, being substantially less than at the lower portion. Openings 52 of ⅛ inch diameter with there being 29 such openings per square inch appear to be the optimum size and number of openings 52 per unit area for this application.

The invention has been described and illustrated with blower 26 being located at the top of the vertically mounted plenum chamber 22. The location of blower 26 and the orientation of the plenum chamber 22 are not critical. The invention works equally well if blower 26 is located at the bottom of plenum chamber 22 for example when plenum chamber 22 is mounted vertically. The invention also works equally well if chamber 22 is positioned horizontally. In addition while it is preferable for blower 26 to blow air into chamber 22 in a direction essentially parallel to side walls 44 this also is not critical, as baffle 36 will function as described if air from pump 26 enters the plenum chamber substantially perpendicular to the plane of side walls 44.

It should be evident that various modifications can be made to the described invention without departing from the scope thereof.

What is claimed as my invention is:

1. An improved air distribution system comprising:
   planar wall means forming a plenum chamber having a pair of ends, one of said ends being an air inlet end;
   wall means closing the other end of said chamber;
   a pair of substantially planar baffle sheets, each baffle sheet having a first edge and a second edge, said baffle sheets being positioned in the plenum chamber so that the first edges are substantially in contact and are positioned substantially in the center of the air inlet end of the chamber, the second edges of the planar baffles being spaced apart, and positioned substantially in the other end of said chamber, each of said baffles having a large number of substantially small openings formed through it;
   air metering slots formed through wall means forming the planar chamber for directing air flow from within the chamber in a direction substantially normal to the wall means; and
   an air pump connected to the air inlet end of the plenum chamber for pumping air into the plenum chamber.

2. The improved air distribution system of claim 1 in which the area of the openings formed through the baffle sheets is substantially in the range of from 30 to 40 percent of the surface area of the baffle sheets.

3. The improved air distribution system of claim 1 in which the area of the openings formed through the baffle sheets is substantially 36 percent of the surface area of the baffle sheets.

4. The improved air distribution system of claim 1 in which the small openings formed through the planar baffle sheets have diameters of substantially one eighth of an inch and the number of such openings is substantially in the range of 25–32 per square inch of the surface area of the baffle sheets.

5. The improved air distribution system of claim 1 in which the number of openings through the baffle means is substantially 29 per square inch of the surface area of the baffle means.

6. Improved air distribution apparatus comprising:
   four substantially planar rectangular walls, each wall having a length and a width, the length of the walls being substantially equal, two of said walls being side walls and the other two end walls;
   said four walls being joined together to form an air duct having a substantially uniform cross sectional area throughout the length of the duct, the length of the duct being the length of the four walls forming the duct, said duct having two ends, one of said ends being an air inlet end;
   a fifth wall having an area substantially equal to the cross sectional area of the duct said fifth wall being secured to the other end of the duct to close that end, the air inlet end of the duct adapted to be connected to an air pump for supplying air under pressure to the duct;
   means forming air metering slots through at least one of the side walls of the duct; and
   a pair of substantially thin planar baffle sheets each baffle sheet having a length and a width substantially equal to the length and width of a side wall, said baffle sheets being mounted in the duct to form a tapering wedge having an edge, the edge of the wedge being positioned substantially in the center of the air inlet end, said baffles each having a large number of circular openings formed through it.

7. The improved air distribution system of claim 6 in which the area of the openings formed through the baffle sheets is substantially in the range of from 30 to 40 percent of the surface area of the baffle sheets.

8. The improved air distribution system of claim 6 in which the area of the openings formed through the baffle sheets is substantially 36 percent of the surface area of the baffle sheets.

9. The improved air distribution system of claim 6 in which the small openings formed through the planar baffle sheets have diameters of substantially one eighth on an inch, and the number of such openings is substantially in the range of 25-32 per square inch of surface area of the baffle sheets.

10. The improved air distribution system of claim 6 in which the number of openings through the baffle sheets is substantially 29 per square inch of surface area of the baffle sheets.

11. In an air distribution system having four rectangular planar walls, two side walls, and two end walls, said walls forming a plenum chamber of substantially rectangular cross sectional area, said chamber having two ends;

means forming an air inlet opening substantially at one end of the chamber;

wall means closing the chamber substantially at the other end;

an air pump connected to the air inlet opening for supplying air under pressure to the interior of the chamber;

means forming a plurality of air metering openings through two of the side walls; the improvements comprising:

a pair of rectangular thin planar sheets of substantially the same size as the interior dimensions of the side walls forming the chamber positioned within the chamber to form a tapering wedge having an apex and defining an interior angle $\alpha$, said apex substantially extending into the air inlet opening of the chamber, a large number of small openings formed to the walls to induce turbulent flow and to dampen out oscillations and air pumped into the chamber, so that the rate of air flow through the air metering openings in the side walls is substantially uniform throughout the length of the chamber.

12. The air distribution system of claim 11 in which the area of the openings formed through the planar sheets is substantially in the range of from 30 to 40 percent of the surface of the baffle means.

13. The air distribution system of claim 11 in which the area of the openings formed through the planar sheets is substantially 36 percent of the surface area of the baffle means.

14. The air distribution system of claim 11 in which the small openings formed through the planar sheet means have diameters of substantially one eighth of an inch and the number of such openings is substantially in the range of 25-32 per square inch of the surface area of the planar sheets.

15. The air distribution system of claim 11 in which the number of openings through the planar sheets is substantially 29 per square inch of the surface area of the planar sheets.

16. The air distribution system of claim 1 in which the angle $\alpha$ is substantially 1.5°.

* * * * *